United States Patent
Karaki

(10) Patent No.: US 7,701,424 B2
(45) Date of Patent: Apr. 20, 2010

(54) DISPLAY PANEL HAVING A SUBSTRATUM AND A PLURALITY OF SCAN LINES FORMED ON THE SUBSTRATUM, A DISPLAY DEVICE, AND ELECTRONIC DEVICE THEREOF

(75) Inventor: Nobuo Karaki, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 1802 days.

(21) Appl. No.: 10/797,054

(22) Filed: Mar. 11, 2004

(65) Prior Publication Data

US 2004/0246684 A1      Dec. 9, 2004

(30) Foreign Application Priority Data

Mar. 19, 2003   (JP)   ............................. 2003-075039
Dec. 26, 2003   (JP)   ............................. 2003-433863

(51) Int. Cl.
   *G09G 3/36*   (2006.01)
(52) U.S. Cl. ..................... 345/87; 345/206; 712/E9.063
(58) Field of Classification Search ..................... 345/7, 345/8, 85, 87, 204, 205, 206; 362/103; 712/E9.063; 326/63; 716/3, 5
   See application file for complete search history.

(56) References Cited

U.S. PATENT DOCUMENTS

| | | | | |
|---|---|---|---|---|
| 5,544,342 | A | * | 8/1996 | Dean ........................... 711/119 |
| 5,912,653 | A | * | 6/1999 | Fitch ............................. 345/87 |
| 5,918,042 | A | * | 6/1999 | Furber ........................ 713/600 |
| 5,922,076 | A |   | 7/1999 | Garde |
| 6,111,448 | A |   | 8/2000 | Shibayama |
| 6,128,678 | A | * | 10/2000 | Masteller ...................... 710/52 |
| 6,188,262 | B1 |   | 2/2001 | Sutherland |
| 6,490,402 | B1 | * | 12/2002 | Ota ............................. 385/147 |
| 6,729,025 | B2 | * | 5/2004 | Farrell et al. .................. 29/854 |
| 6,787,403 | B2 |   | 9/2004 | Inoue et al. |

(Continued)

FOREIGN PATENT DOCUMENTS

JP         A-11-85310         3/1999

(Continued)

OTHER PUBLICATIONS

Kagotani et al.; "A Synthesis Method for Asynchronous Control Circuits based on Process Description;" *The Special Interest Group Notes of IPSJ*; vol. 91, No. 110, pp. 75-82, Dec. 1991; Information Processing Society of Japan. (with abstract).

*Primary Examiner*—Chanh Nguyen
*Assistant Examiner*—Pegeman Karimi
(74) *Attorney, Agent, or Firm*—Oliff & Berridge, PLC

(57) ABSTRACT

It is an object of the present invention to propose a sheet computer that eliminates the drawback in operational speed caused by clock delays of a system clock and that is capable of high speed operation. In order to achieve this object, in the sheet computer of the present invention, a display circuit and peripheral circuits connected to the display circuit are fabricated on the same substratum and the peripheral circuits constitute an asynchronous system without global clocking. In the asynchronous system, processes constituting minimum function circuits perform mutual handshaking by channels and drive events actively or passively. The asynchronous system does not use global clocking and it is therefore possible to implement lower power consumption and a higher operational speed.

13 Claims, 6 Drawing Sheets

CONSTITUTIONAL VIEW OF CIRCUIT FOR REMOVING PASSIVE CLOCKING

U.S. PATENT DOCUMENTS

| | | |
|---|---|---|
| 6,872,635 B2 | 3/2005 | Hayashi et al. |
| 7,195,687 B2 | 3/2007 | Hayashi et al. |
| 7,205,212 B2 | 4/2007 | Hayashi et al. |
| 7,205,213 B2 | 4/2007 | Hayashi et al. |
| 7,205,214 B2 | 4/2007 | Hayashi et al. |
| 7,221,016 B2 | 5/2007 | Inoue et al. |
| 7,429,965 B2 * | 9/2008 | Weiner .................. 345/30 |
| 7,444,772 B2 * | 11/2008 | Harasawa et al. ............ 40/586 |
| 2001/0043168 A1 * | 11/2001 | Koyama et al. ............... 345/52 |
| 2001/0043175 A1 * | 11/2001 | Yasukawa .................... 345/87 |
| 2003/0095556 A1 * | 5/2003 | Horie et al. ................. 370/405 |
| 2003/0132896 A1 * | 7/2003 | Matsueda .................... 345/55 |
| 2007/0048891 A1 | 3/2007 | Hayashi et al. |

FOREIGN PATENT DOCUMENTS

| | | |
|---|---|---|
| JP | A-2000-353155 | 12/2000 |
| JP | A-2000-357025 | 12/2000 |
| JP | A 2001-516926 | 10/2001 |
| JP | A 2001-326626 | 11/2001 |
| JP | A 2002-14914 | 1/2002 |
| JP | A-2002-110829 | 4/2002 |
| JP | A 2002-523857 | 7/2002 |
| JP | A-2002-524790 | 8/2002 |
| JP | A-2002-366059 | 12/2002 |
| JP | A-2002-368282 | 12/2002 |

* cited by examiner

INTERPROCESS COMMUNICATION

INTERPORT COMMUNICATION

CONSTITUTIONAL VIEW OF CIRCUIT FOR REMOVING PASSIVE CLOCKING

TWO-PHASE HANDSHAKING

FOUR-PHASE HANDSHAKING

DISPLAY PANEL HAVING A SUBSTRATUM AND A PLURALITY OF SCAN LINES FORMED ON THE SUBSTRATUM, A DISPLAY DEVICE, AND ELECTRONIC DEVICE THEREOF

BACKGROUND OF THE INVENTION

1. Field of the Invention

The present invention relates to sheet computers, wearable computers, display devices, fabrication methods, and electronic devices thereof, and, more particularly, to improved technologies for implementing multifunctional and high-performance electronic circuits that are fabricated on thin substrata.

2. Description of the Related Art

Liquid crystal displays have come into widespread use in the fields of information and consumer electronics, and so forth. However, the technology known as 'System-On-Panel' that is oriented toward further performance increases and cost reductions is still under development. 'System-On-Panel' is an integration technology for forming a liquid crystal display and peripheral circuits on the same substratum. In addition to making it possible to implement increased reliability and cost reductions due to shortening the manufacturing and testing processes of the display units, this technology makes it feasible to develop the application products that are of a high density, more multifunctional and more compact than ever before.

As a means of implementing the System-On-Panel, there have been attempts at using the poly-silicon TFT technologies, which perform thin film deposition at lower process temperature of 500° C. or less, in order to form TFT circuits on glass substrata. However, the wiring resistance and the critical path delay of the circuits tends to increase as the feature size of the TFT technology reduces and the chip area increases. In addition, in comparison with single-crystal TFT, the mobility of poly-silicon TFT is lower, and hence the operating speed of the poly-silicon TFT circuits is kept lower, especially in synchronous design where the global clock drives the circuits.

This is because the maximum operating frequency of conventional synchronous circuits with the global clocking is the reciprocal of the total delay of the critical path including design margin of delay against temperature and supply voltage variation. Plus both clock jitter and skew must account for the drawback in the expected operating frequency.

As a means of solving this problem, local clocking has been considered. This technique divides the whole circuit into a plurality of sub-blocks from functional perspective, and supplies dedicated local clocks to each of the sub-blocks. The critical path of sub-block must be substantially shorter than that of the original whole circuit. While each of the sub-blocks is constituted as a synchronous circuit that is synchronously driven by the local dock, each sub-block connects the other asynchronously. That is, although the circuit as a whole operates asynchronously, locally, the circuits operate synchronously. By a means of reducing the delay of the critical path, the performance of the whole circuit can be greatly improved.

As patent publications that make reference to local clocking, Japanese Patent Publication No. 2001-516926, Japanese Patent Application Laid Open No. 2001-326826, and Japanese Patent Application Laid Open No. 2002-14914, and so forth, are known, for example. Further, Japanese Patent Publication No. 2002-523857, or the like, is known as a patent that refers to reusing synchronous circuit blocks as IPs by asynchronously connecting them as a whole.

However, because the phase of the local clocks differs for each sub-block, the process of designing a circuit in which sub-blocks operating in local clocks are asynchronously connected is extremely complex and difficult in order to form a high-performance large-scale circuit on a glass substratum as a System-On-Panel, the development of new design technique that makes it possible to disregard the dock skew is desirable. In addition, because the amount of power dynamically consumed in conventional synchronous circuit driven by a global clock is large, circuit design technique implementing low power consumption is required.

SUMMARY OF THE INVENTION

Accordingly, it is an object of the present invention to provide sheet computers, wearable computers, display devices, fabrication methods and electronic devices thereof which eliminate the drawback in the speed of the circuit operation due to clock delays, clock skew and clock jitter resulting from the adoption of a system dock, and which permit high speed operation and lower power consumption.

In order to solve the above problems, the sheet computer of the present invention is a sheet computer in which electronic circuits are fabricated on a substratum, wherein the electronic circuits constitute an asynchronous system without global clocking. Because the electronic circuits of the sheet computer constitute an asynchronous system without global clocking, it is enabled to implement a sheet computer that solves the problems of clock delays, clock skew, clock jitter, and so forth and that is capable of high-speed operation. Further, the electronic circuits do not use global clocking and hence low power consumption can be implemented.

The sheet computer according to another embodiment of the present invention is a sheet computer in which a display circuit and peripheral circuits connected to the display circuit are fabricated on the same substratum, wherein the peripheral duets constitute an asynchronous system without global clocking. This constitution makes it possible to implement a sheet computer in which the display circuit is fabricated as a higher capacity, more multifunctional sheet computer that consumes less power.

In the sheet computer according to the present invention, the peripheral circuits comprise a plurality of circuits that have ports, which are connected together by channels. The ports that actively request data transfers and ports that passively accept data transfer requests have different attributes respectively. An asynchronous system can be constituted by permitting handshake communication between ports.

In the sheet computer of the present invention, the substratum is preferably flexible. A flexible sheet computer can be implemented by forming the sheet computer on a flexible substratum.

In the sheet computer according to the present invention, the electronic circuit can also be stacked in multiple layers on the substratum. Such a constitution makes it possible to implement a multifunctional and high-capacity sheet computer.

The wearable computer according to the present invention is a wearable computer in which electronic circuits are fabricated for wearability's sake, wherein the electronic circuits constitute an asynchronous system without global docking. Such a constitution makes it possible to provide a high-speed, high-capacity, and low-power wearable computer.

In the wearable computer according to the present invention, the peripheral circuits comprise a plurality of circuits that have ports, which are connected together by channels. The ports that actively request data transfers and ports that passively accept data transfer requests desirably have different attributes respectively. An asynchronous system can be constituted by permitting handshake communication between ports.

The wearable computer according to the present invention is preferably formed on a flexible substratum. A flexible wearable computer can be implemented by forming the wearable computer on a flexible substratum.

In the wearable computer according to the present invention, the electronic circuits can also be stacked in multiple layers on the flexible substratum. This constitution makes it possible to implement a multifunctional and high-capacity wearable computer.

The display device according to the present invention is a display device in which a display circuit and peripheral circuits connected to the display circuit are fabricated on the same substratum, wherein the peripheral circuits constitute an asynchronous system without global clocking. This constitution makes it possible to implement a high-speed, high-capacity, and low-power display device that consumes less power.

The display device according to the present invention is a display device in which a liquid crystal display circuit and peripheral circuits connected to the liquid crystal display circuit are fabricated a substratum, wherein the peripheral circuits constitute an asynchronous system without global clocking. This constitution makes it possible to implement a high-speed, high-capacity, and low-power display device.

In the display device according to the present invention, the peripheral circuits comprise a plurality of circuits that have ports which are connected together by channels. The ports that actively request data transfers and ports that passively accept data transfer requests desirably have different attributes respectively. An asynchronous system can be constituted by permitting handshake communication between ports.

Further, the present invention is not limited to a liquid crystal display, being equally applicable to organic EL panels and so forth. Examples of other such panels include electrophoretic panels constituted by electrophoretic elements, and electron emission panels constituted by electron emission elements that cause electrons generated by applying an electric field to strike a light emission plate.

Furthermore, electronic devices in which the display device according to the present invention is fabricated can be implemented as high-capacity, multifunctional electronic devices that consume less power. Here, 'electronic devices' denotes devices in, general that afford a prescribed function by means of a plurality of elements or a combination of circuits, and can comprise a single or a plurality of circuit substrata. There are no particular restrictions on the constitution, which may, for example, include an IC card, a smart card, a cellular phone, a video camera, a personal computer, a headmount display, a rear- or front-type projector, a wearable-type health management device, a wearable-type toy, a skewed-distribution type wireless sensor, an RFID, mountable thermometer, focusing device with a display function, digital camera viewfinder, portable TV, DSP device, PDA, electronic organizer, sheet-type calculator, electronic paper, illuminated bulletin board, advertising display, and a wireless tag with display function.

The sheet computer fabrication method according to the present Invention comprises the steps of: fabricating circuit chips comprising asynchronous circuits without global clocking on an original substratum; transferring the circuit chips thus formed to a final substratum; and separating the circuit chips thus transferred to the final substratum from the original substratum. This fabrication method permits surface-free fabrication and can therefore be used without any particular restrictions on the quality and shape of the substratum.

In the sheet computer fabrication method according to the present invention, the substratum is suitably flexible. A flexible sheet computer can be fabricated by using a flexible substratum as the substratum.

The sheet computer fabrication method according to the present invention preferably further comprises the step of stacking the circuit chips in multiple layers on the flexible substratum. A multifunctional and high-capacity sheet computer can be implemented by this fabrication method.

The wearable computer fabrication method according to the present invention comprises the steps of: fabricating circuit chips comprising asynchronous circuits without global clocking on an original substratum; transferring the circuit chips to a final substratum; and separating the circuit chips thus transferred to the substratum from the original substratum. This fabrication method permits surface-free fabrication and can therefore be used without any particular restrictions on the quality and shape of the substratum.

In the wearable computer fabrication method according to the present invention, the substratum is suitably flexible. A flexible wearable computer can be fabricated by using a flexible substratum as the substratum.

The wearable computer fabrication method according to the present invention preferably further comprises the step of stacking the circuit chips in multiple layers on the flexible substratum. A multifunctional and high-capacity wearable computer can be implemented by this fabrication method.

The display device fabrication method according to the present invention comprises the steps of: fabricating circuit chips comprising asynchronous circuits without global clocking on an original substratum; transferring the circuit chips to a final substratum; and separating the circuit chips thus transferred to the final substratum from the original substratum. This fabrication method permits surface-free fabrication and can therefore be used without any particular restrictions on the quality and shape of the substratum.

In the display device fabrication method according to the present invention, the final substratum is suitably flexible. A flexible display device can be fabricated by using a flexible substratum as the substratum.

The display device fabrication method according to the present invention preferably further comprises the step of stacking the circuit chips in multiple layers on the flexible substratum. A multifunctional and high-capacity display device can be implemented by this fabrication method.

DESCRIPTION OF THE PREFERRED EMBODIMENTS

First Embodiment of the Invention

Figure 5:
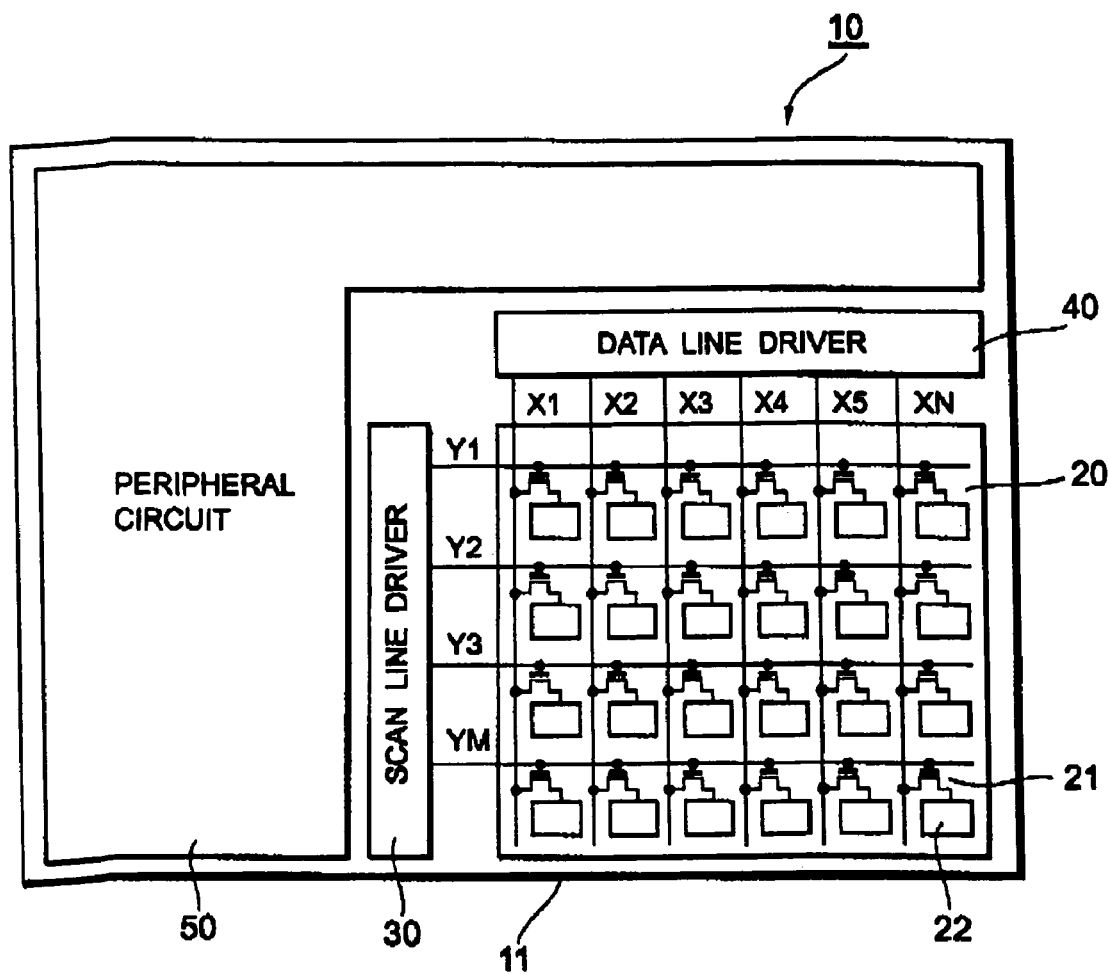
FIG. 5 is a planar view of the sheet computer.

FIG. 5 is a constitutional view of the circuit of a sheet computer 10 in which a liquid crystal display that is fabricated by applying the System-On-Panel technology according to this embodiment is fabricated.

As shown in FIG. 5, the sheet computer 10 is mainly constituted comprising a liquid crystal display 20 fabricated on a glass LCD panel 11, and peripheral circuits 50 that render an image displayed on the liquid crystal display 20, and so forth. The liquid crystal display 20 is an active matrix-type LCD in which a TFT 21 that functions as a switching element, and a pixel electrode 13 are arranged for each of the pixels in M rows and N columns. A scanning signal is sequentially output to M scan lines Y1, Y2, ... YM by a scan line driver 30 by means of time-division scanning to turn ON each TFT 21 lined up on the same scan line. A data signal required for the gray scale display of each pixel is supplied by a data line driver 40 to N data lines X1, X2, ... XN arranged in the column direction of the liquid crystal display 20, the data signal being written to pixel electrodes 22 on an active scan line. The voltage of the data signal thus written to the pixel electrodes 22 is held for the duration of a single field and the optical transmittance of the liquid crystal layer is controlled to obtain a predetermined gray scale.

The peripheral circuits 50 are electronic circuits (function circuits) designed by means of asynchronous design technology and are constituted comprising a CPU, memory, and so forth. These circuits are conventionally connected to the liquid crystal display as additional circuits and are not formed on the same glass substratum. However, in this embodiment, because asynchronous design technology without global clocking is applied to the circuit design of the peripheral circuits 50, a large scale circuit that eliminates problems such as clock delays, clock skew and dock jitter and permits high speed operation can be formed on a glass substratum by a TFT fabrication process.

In this specification, a 'synchronous design' denotes a circuit design that is intended to implement a circuit operation in which global clocking for centralized control of the system serves as a reference, while an 'asynchronous design' signifies a circuit design that is intended to perform decentralized control while minimum function circuits actively or passively cooperate locally without using global clocking. In the synchronous design, each of the operations, such as command fetch, decoding, execution, and read/write are performed in sync with global docking, and hence problems such as clock delays, clock skew, and clock jitter are generated in the process of implementing a high-speed circuit operation. However, with an asynchronous design, minimum function circuits operate actively or passively via mutual handshaking, and hence this problem is not produced.

In the case of an asynchronous design, the minimum function circuits are controlled by means of event driving and thus operate only when it is judged that an active operation is required and when it is judged that a passive operation is required. That is, each of the minimum function circuits is capable of working in parallel independently of the other minimum function circuits and is not required to wait until the processing of the other minimum function circuits has finished. The minimum function circuits are therefore capable of advancing the processing at the stage where preparation for the execution of desired processing is complete. In this specification, a system whose circuit design is an asynchronous design is known as an 'asynchronous system'. An asynchronous system does not employ a system clock and hence consumes an extremely small amount of power while waiting and is capable of high-speed operation with low latency.

Figure 1:
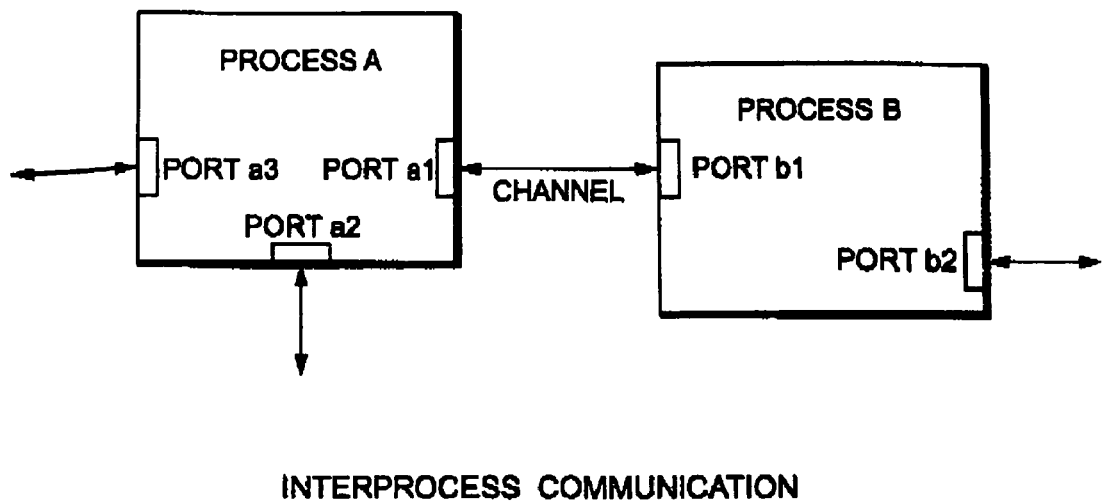
FIG. 1 is an explanatory view of the interprocess communication of an asynchronous system.

FIG. 1 is an explanatory view of the interprocess communication of the asynchronous system according to this embodiment. In this specification, minimum function circuits constituting the asynchronous system are known as 'processes'. Each process is connected to another process by 'channels', and actively or passively drives an event through local cooperation. The channels are connected at each end thereof to a 'port'. In the example shown in FIG. 1, process A has ports a1, a2 and a3, and process B has ports b1 and b2. Port a1 and port b1 of process A and process B respectively are connected by the channels.

Figure 2:
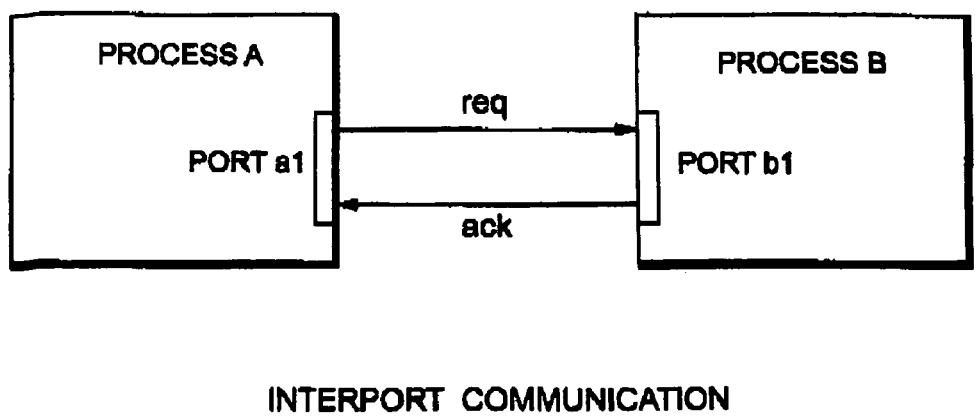
FIG. 2 is an explanatory view of communication between process ports.

FIG. 2 is an explanatory view of communication between process ports. Since processes operate actively or passively, the attributes 'active' or 'passive' is assigned to all the ports. Here, a case where process A issues a request for a data transfer to process B is shown. The attribute 'Send Active' is assigned to port a1 of process A that actively requests the data transfer, and the attribute 'Receive Passive' is assigned to port b1 of process B that passively accepts the data transfer request. When process A actively requests a data transfer from process B from the beginning, the attribute 'Receive Active' is assigned to port a1, and the attribute 'Send Passive' is assigned to port b1 of process B that passively performs the data transfer. In this communication between ports, handshaking is performed by sending and receiving req/ack signals.

Figure 4A:
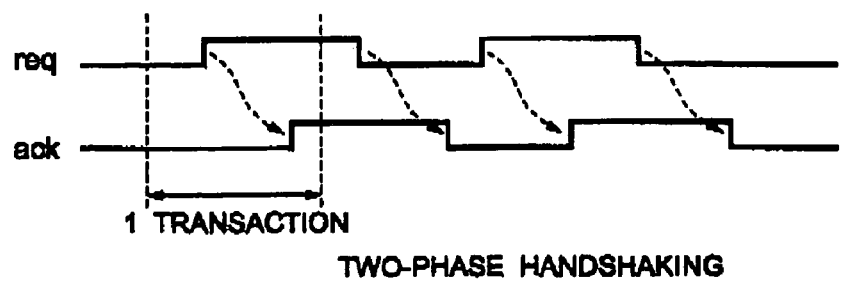
FIGS. 4A to 4B are explanatory views of a communication handshake between ports.

FIG. 4 is an explanatory view of a handshake of interport communication. Here, FIG. 4A shows two-phase (Non Return to Zero) handshaking in which req/ack signals are sent and received at the rising or trailing edge of the signal. For example, in the above example, the req signal rises from the L level to the H level or falls from the H level to the L level when the req signal is sent from port a1 to port b1. Port b1 senses that the req signal has been transmitted from port a1 to port b1 by detecting the rising edge or trailing edge of the req signal. The level of the ack signal may be raised from the L level to the H level or lowered from the H level to the L level when port b1 sends back the ack signal to port a1. Handshaking is then complete.

Figure 4B:
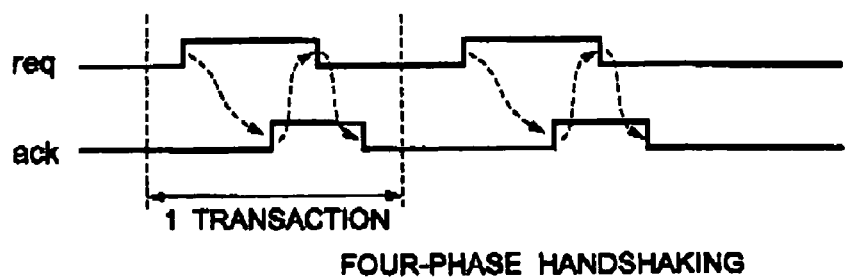

On the other hand, FIG. 4B shows four-phase (Return to Zero) handshaking in which req/ack signals are sent and received at the signal level. For example, in the above example, the req signal may be raised from the L level to the H level when the req signal is sent from port a1 to port b1. Port b1 senses that the req signal has been transmitted upon sensing the transition of the req signal to the H level. The level of the ack signal may be raised from the L level to the H level when port b1 sends back the ack signal to port a1. Having confirmed that the level of the ack signal has made the transition to the H level, port a1 lowers the level of the req signal from the H level to the L level. Having confirmed that the level of the req signal has made the transition from the H level to the L level, port b1 lowers the level of the ack signal from the H level to the L level, and the handshaking ends.

Figure 3:
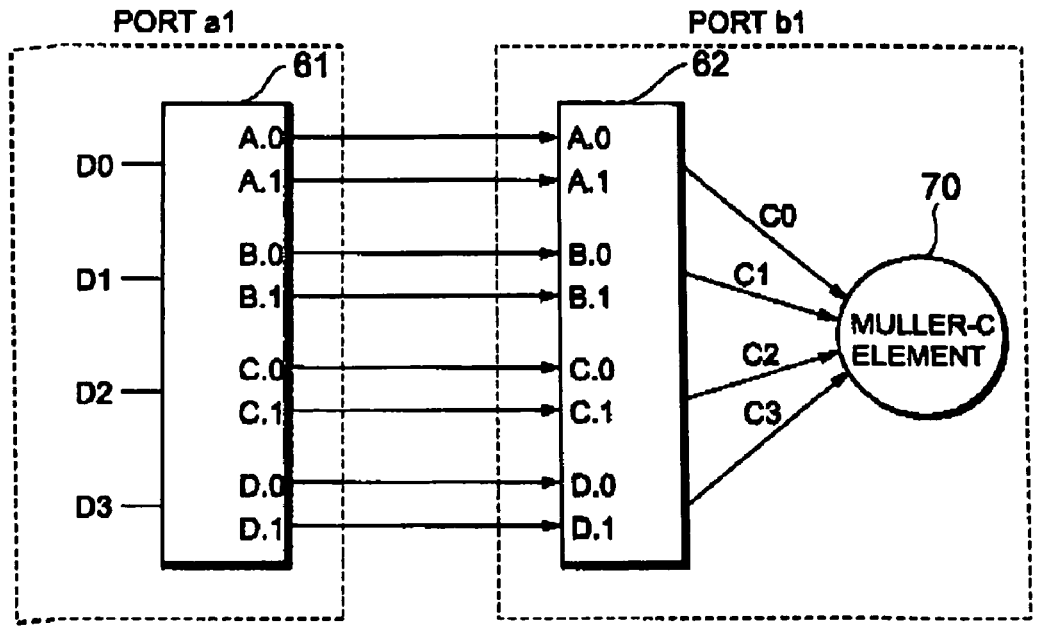
FIG. 3 is a constitutional view of a circuit for removing passive clocking.

FIG. 3 is a block diagram that focuses on the constitution of the circuit for removing passive clocking of the asynchronous system. Each of the ports performing interprocess communication comprises an encoder and a decoder for subjecting the signal to two-phase encoding/decoding. Here, a case where data is transferred from port a1 to port b1 is assumed and hence, for the sake of an expedient description, port a1 comprises an encoder 61, while port b1 comprises a decoder 62. Further, in order to simplify the description, the data channels are four-bit data channels. Four-bit data D0 to D3 are encoded by the encoder 61 and then decoded to produce four-bit data D0 to D3 by the decoder 82. However, the four-bit data D0 to D3 resulting from the decoding are not shown for the sake of an expedient description. Reception completion signals C0 to C3 for the bit data received by port b1 are input to a Muller-C element 70. The Muller-C element 70 is a rendezvous circuit that receives the reception completion signals C0 to C3 indicating the end of each operation, and performs control so that each circuit commences the operation for the first time at the stage where data required for the processing has been prepared. Since an inherent temporal delay is present in the processing time of each individual process, the provision of the Muller-C element 70 is a mechanism for waiting so that the next operation is not started until all the processes that are in progress have ended.

With the embodiment described above, the peripheral circuits 50 are formed by using asynchronous design technology, and hence it is possible to fabricate, on the LCD panel 11, a large scale circuit that eliminates problems such as clock delays, clock skew and clock jitter and permits high speed operation. It is therefore possible to fabricate a variety of function circuits on the LCD panel 11, and therefore a multifunctional, high-capacity LCD panel 11 can be implemented. Further, because the peripheral circuits 50 do not require a system clock, lower power consumption can be implemented.

Second Embodiment of the Invention

Next, the fabrication method for the sheet computer above will be described.

FIG. 7 shows a cross-sectional view of the sheet computer fabrication steps. FIG. 7A shows the alignment stage of the separation transfer step. A circuit chip 80 is formed on an original substratum 81 via a separating layer 82. The circuit chip 80 is a chip comprising circuits for implementing desired functions (a computer circuit, communication circuit, display circuit, and so forth, for example), and all or some of these circuits constitute an asynchronous circuit. The original substratum 81 is desirably constituted by means of an optically transparent material with an optical transmittance that is preferably 10% or more and more preferably 50% or more. When the optical transmittance is too low, the attenuation of the irradiating light is large and hence a large amount of irradiation energy is required in order to produce separation within the separating layer 82 or separation at the interface thereof. The original substratum 81 is preferably constituted by a material with a thermal distortion point that is higher than the process temperature (350° C. to 1000° C.), and is suitably heat resistant glass such as quartz glass, soda glass, Corning or Nippon Electric glass OA-2, or a synthetic resin, for example. The thickness of the original substratum 81 is not particularly restricted, a film thickness on the order of 0.1 to 5.0 mm being preferable, or more preferably 0.5 to 5.0 mm. In order to produce a constant amount of transmitted light, the thickness of the original substratum 81 is desirably constant.

The separating layer 82 is a thin film that is constituted such that separation is generated within the layer and/or at the interface thereof when this layer is irradiated with the irradiating light. By subjecting the separating layer 82 to the irradiating light, the bond strength between the atoms or molecules of the material constituting the separating layer 82 is lost or reduced. Causes of the separation within the layer or at the interface include abrasion and outgassing, for example. 'Abrasion' is intended to mean a process in which a solid material that absorbs irradiating light is optically or thermally excited, such that the bonds between atoms or molecules in the surface of this material or inside this material are broken, thereby discharging the atoms, and predominantly involves a change of phase such as one in which all or part of the material forming the separating layer 82 melts or evaporates.

The composition of the separating layer 82 is illustrated below.

(1) amorphous silicon;

(2) various oxide ceramics or dielectrics such as silicon oxide, silicon oxide compound, titanium oxide, titanium oxide compound, zirconium oxide, zirconium oxide compound, lanthanum oxide, and lanthanum oxide compound.

(3) Ceramics or ferroelectrics such as PZT, PLZT, PLLZT, and PBZT;

(4) nitride ceramics such as silicon nitride, aluminum nitride, and titanium nitride;

(5) organic macromolecular materials;

(6) metals.

Here, SiO, $SiO_2$, and $Si_3O_2$, or the like, for example, are suitable as the silicon oxides in (2). $K_2SiO_3$, $Li_2SiO_3$, $CaSiO_3$, $ZrSiO_4$, $Na_2SiO_3$, or the like, for example, are suitable as silicon oxide compounds. TiO, $Ti_2O_3$, $TiO_2$, or the like, are suitable as titanium oxides. $BaTiO_4$, $BaTiO_3$, $Ba_2Ti_9O_{20}$, $BaTi_5O_{11}$, $SrTiO_3$, $PbTiO_3$, $MgTiO_3$, $ZrTiO_2$, $SnTiO_4$, $Al_2TiO_5$, $FeTiO_3$, or the like, for example, are suitable as titanium oxide compounds. $ZrO_2$ or the like is suitable as the zirconium oxide. $BaZrO_3$, $ZrSiO_4$, $PbZrO_3$, $MgZrO_3$, $K_2ZrO_3$, or the like, for example, are suitable as zirconium oxide compounds.

Furthermore, the organic macromolecular materials in (5) have bonds such as —$CH_2$—, —CO— (ketone), —CONH— (amide), —NH— (imide), —COO— (ester), —N=N— (azo), —CH=N— (Shift), or the like, for example, and there are no particular restrictions on these materials provided that same have multiple bonds. In addition, organic macromolecular materials may have aromatic hydrocarbons in the constitutional formula. Polyolefins such as polyethylene and polypropylene, and polyimides, polyamides, polyesters, polymethylmethacrylate (PMMA), polyphenylenesulfide (PPS), polyestersulfone (PES), and epoxy resins, or the like, are suitable as such organic macromolecular materials.

Further, the metals in (6) include Al, Li, Ti, Mn, In, Sn, Y, La, Ce, Nd, Pr, Gd, Sm or alloys containing at least one of these metals.

The film thickness of the separating layer 82 differs according to conditions such as the composition of the separating layer 82, as well as the layer constitution and the formation method thereof, and is preferably about 1 nm to 20 μm, more preferably about 10 nm to 20 μm, and even more preferably 41 nm to 1 μm. When the film thickness of the separating layer 82 is too thin, the homogeneity of the deposition film is impaired, and therefore unevenness sometimes occurs in the separation. On the other hand, when the film thickness is too thick, a large amount of irradiating light is required in order to ensure favorable separation properties for the separating layer 82 and time is required in order to remove the separating layer 82 in subsequent steps. There are no particular limitations on the method used to form the separating layer 82. This method may be suitably chosen according to conditions such as the film composition and film thickness. A variety of vapor deposition techniques such as CVD, vapor deposition, molecular beam deposition, sputtering, ion plating, and PVD, a variety of plating techniques such as electroplating, immersion plating, and electroless plating, coating methods such as the Langmuir-Blodgett method, spin coating, spray coating, roll coating, various printing methods, transfer methods, inkjet coating, powder jet coating, sol-gel coating, or the like, are possible.

On the other hand, an adhesive 84 is applied to a substratum 83 in correspondence with the location in which the circuit chip 80 is to be fabricated. Because surface-free fabrication is feasible if the separation transfer method of this embodiment is used, the material, shape, and so forth, of the substratum 83 are not particularly limited. A variety of materials and shapes can be used. Substrata that can be used for the substratum 83 include, for example, plastic substrata, steel substrata, metal substrata, resin substrata, glass substrata, and flexible substrata, or the like. If a glass substratum is used as the substratum 83, the sheet computer mentioned above can be fabricated.

Figure 7A:
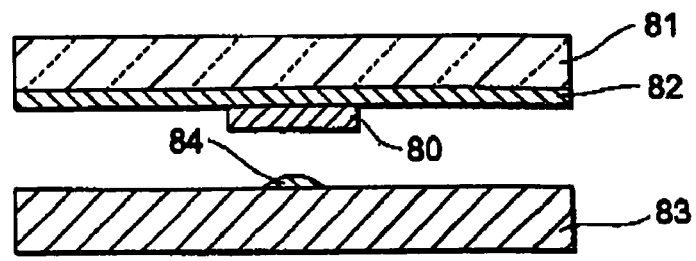
FIGS. 7A to 7D are cross-sectional views of the fabrication steps of the sheet computer of the present invention.
Figure 7B:
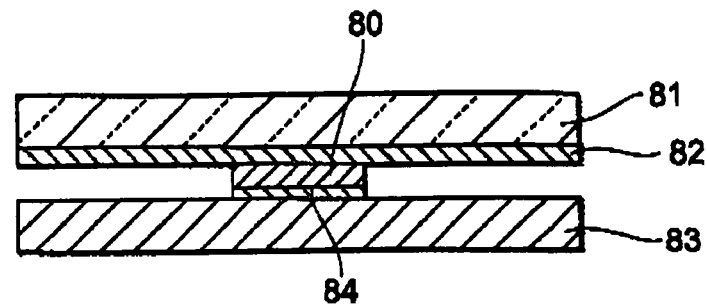
Figure 7C:
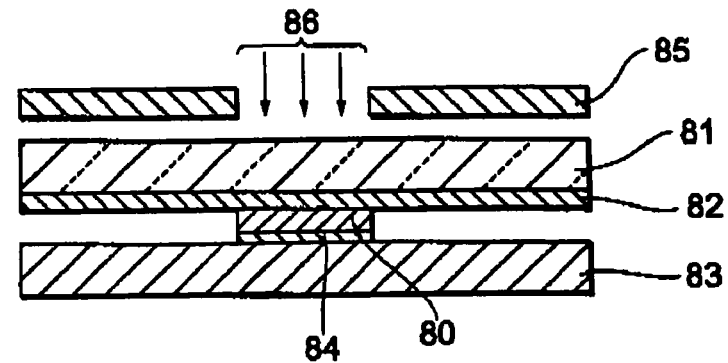
Figure 7D:
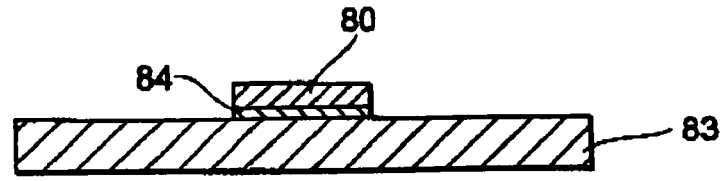

When alignment of the original substratum 81 and substratum 83 is complete, the original substratum 81 and substratum 83 are pressure-bonded as shown in FIG. 7B, and hence the circuit chip 80 is then joined to the substratum 83. Next, as shown in FIG. 7C, irradiating light is irradiated from the rear of the original substratum 81 via a mask 85 so that irradiating light 86 is made to irradiate the circuit chip 80 alone. The irradiating light 86 is absorbed by the separating layer 82 after being transmitted by the original substratum 81, thereby inducing separation within the separating layer 82 or at the interface thereof. Accordingly, the molecular bonds in the separating layer 82 weaken and the circuit chip 80 separates from the original substratum 81. There are no particular restrictions on the irradiating light 86 as long as same generates separation within the separating layer 82 or at the interface thereof. Possible examples include X rays, ultraviolet rays, visible light, infrared light (heat waves), laser light, millimeter waves, microwaves, an electron beam, radiation ($\alpha$ rays, $\beta$ rays, and $\gamma$ rays). A laser beam is suitable by virtue of readily causing abrasion to occur, for example. Possible laser beams include fluid lasers, solid lasers, or the like, and especially suitable lasers are excimer lasers, Nd-YAG lasers, Ar lasers, $CO_2$ lasers, and He—Ne lasers. Excimer lasers output high energy with a short wavelength, and can therefore generate separation in the separating layer 82 within a very short time. In order to induce abrasion within the separating layer 82, the wavelength of the irradiated laser light is desirably about 100 to 350 nm when there is wavelength dependence. Further, in order to generate separation within the separating layer 82 or at the interface thereof by inducing a change in phase such as outgassing, vaporization, and sublimation, the wavelength of the laser light is desirably about 350 to 1200 nm. When the circuit chip 80 is separated from the original substratum 81, the transfer of the circuit chip 80 to the substratum 83 is finished as shown in FIG. 7D.

Therefore, because the surface-free fabrication method is used, there are no particular restrictions on the material, shape, and so forth used for the substratum 83, these being optional. If a flexible substratum is used as the substratum 83, a flexible computer, wearable computer, and display device can be fabricated. Further, by using the separation transfer method, the sheet computer and so forth can be made extremely thin and also constitut an asynchronous circuit, meaning that there are then the merits of low power consumption and very little electromagnetic radiation, and so forth. Although the description above illustrated the fabrication steps for a sheet computer, the display device can be fabricated by means of the same method. Further, in addition to various substrata mentioned above for the substratum 83, a high-speed, high-capacity wearable computer can be fabricated if a variety of garments such as lounge suit, workwear, sport clothes, a raincoat, a one-piece dress, a kimono, an apron, overalls, a jumper, pants, a hat, or a holder on a belt, a pochette, a shoulder bag, or the like, for example, is used. The fabrication surface for fabricating the circuit chip 80 is not limited to a level surface. All or part of the fabrication surface may be a curved surface (such as an uneven surface, twisted surface, or bent surface, for example).

Figure 6:
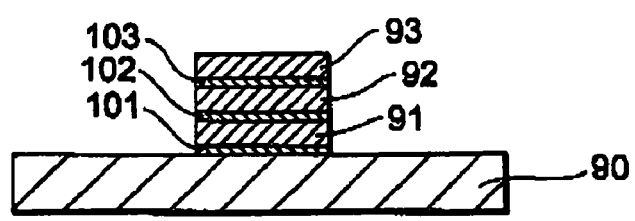
FIG. 6 shows a circuit-chip multilayer stacked structure.

Further, if the separation transfer method above is employed, a higher capacity sheet computer can be fabricated by stacking the circuit chip in multiple layers. FIG. 6 shows the multilayer stacked structure of the circuit chip. A circuit chip 91 is transferred onto a substratum 90 via an adhesive layer 101 by using a first separation transfer step. Further, a circuit chip 92 is transferred onto the circuit chip 91 via an adhesive 102 by using a second separation transfer step. Finally, a circuit chip 93 is transferred onto the circuit chip 92 via an adhesive 103 by using a third separation transfer step. The separation transfer method is a surface-free fabrication method and therefore permits stabilized circuit fabrication even at uneven or twisted points on the fabrication surface. The circuit chip stacking method is not limited to the above-mentioned fabrication steps. For example, a stacked structure produced by stacking the circuit chips 91, 92, and 93 in multiple layers beforehand may transferred onto the substratum 90.

Third Embodiment of the Invention

FIGS. 8A to 8F show examples of electronic devices to which the display device of the present invention has been applied.

Figure 8A:
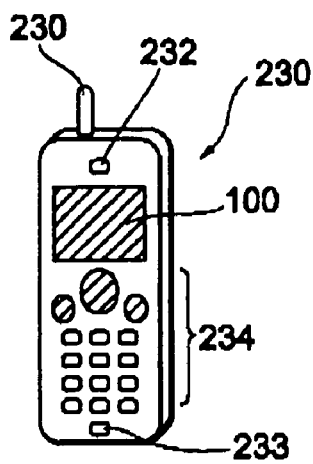
FIGS. 8A to 8F show electronic devices to which the display device of the present invention has been applied.

FIG. 8A shows an example of a cellular phone application. The cellular phone 230 comprises an antenna 231, a speech output portion 232, a speech input portion 233, a keypad 234, and the display device 100.

Figure 8B:
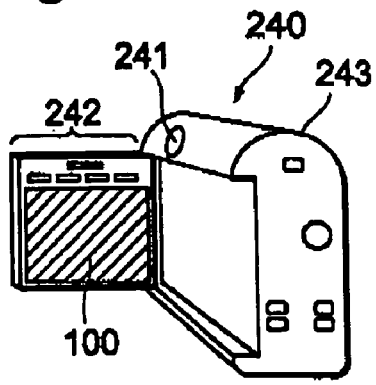

FIG. 8B shows an example of a video camera application. The video camera 240 comprises a receiver 241, a keypad 242, a speech input portion 243, and the display device 100.

Figure 8C:
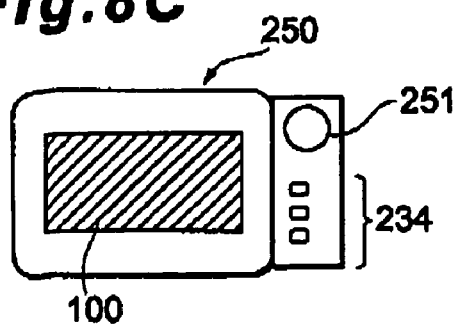

FIG. 8C shows an example in which the display device has been applied to a portable personal computer. The computer 250 comprises a camera portion 251, a keypad 252, and the display device 100.

Figure 8D:
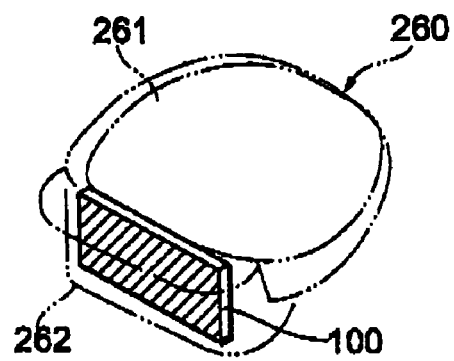

FIG. 8D shows an example in which the display device has been applied to a headmount display. The headmount display 280 comprises a headband 261, an optical absorption portion 262, and the display device 100.

Figure 8E:
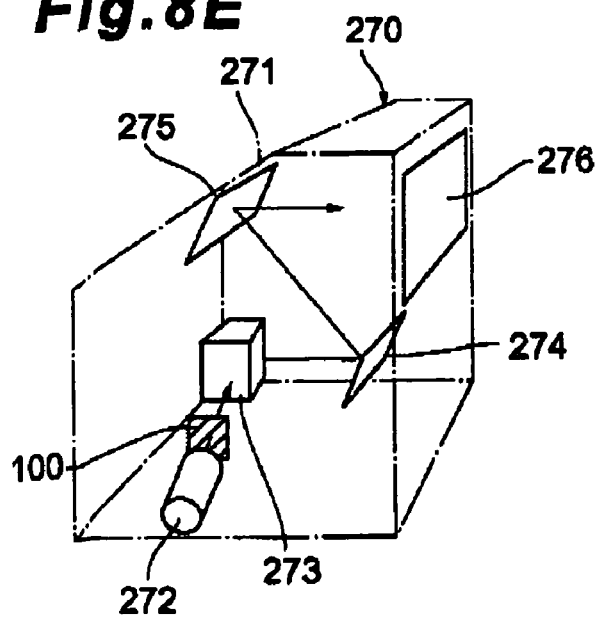

FIG. 8E shows an example in which the display device has been applied to a rear-type projector. The projector 270 comprises, in an enclosure 271, a right source 272, an optical synthesis system 273, a mirror 274, a mirror 275, a screen 276, and the display device 100.

Figure 8F:
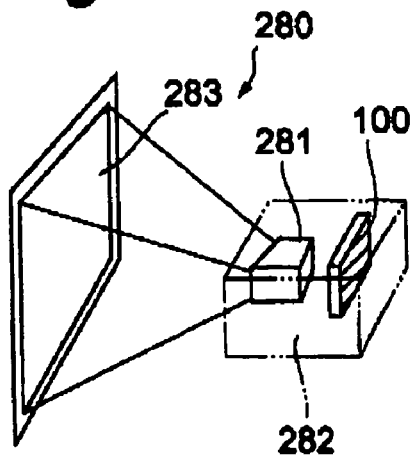

FIG. 8F shows an example in which the display device is applied to a front-type projector. The projector 280 comprises, in an enclosure 282, an optical system 281, and the display device 100, and is constituted to be capable of displaying images on a screen 283.

These display devices 100 are all panels made by fabricating a display circuit and peripheral circuits on the same substratum by using System-On-Panel technology. The peripheral circuits constitute an asynchronous system.

Figure 9A:
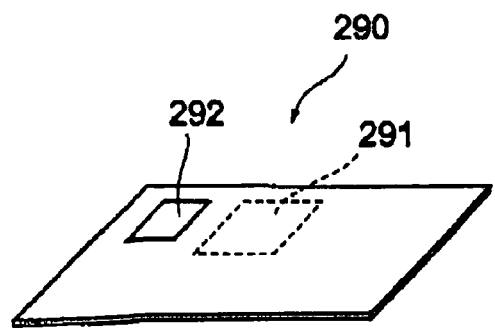
FIGS. 9A to 9E show electronic devices to which the sheet computer or wearable computer of the present invention has been applied.

FIGS. 9A to 9E show examples of an electronic device to which the sheet computer or wearable computer of the present invention has been applied;

FIG. 9A shows an example of a smart card application. The smart card 290 comprises a principal circuit 291 and a fingerprint sensing electrode 292.

Figure 9B:
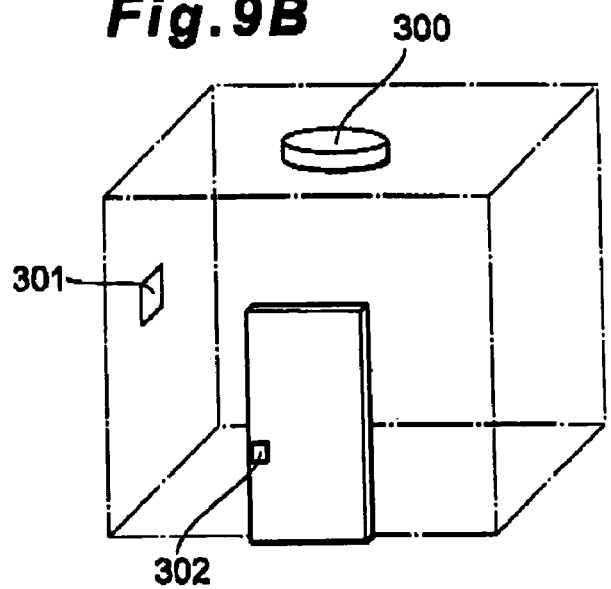

FIG. 9B shows an example of a skewed-distribution type wireless sensor to application. Possible application examples of a skewed-distribution type wireless sensor include an internal wireless sensor 300 of a lighting device, an indoor temperature sensor 301, and a door sensor 302.

Figure 9C:
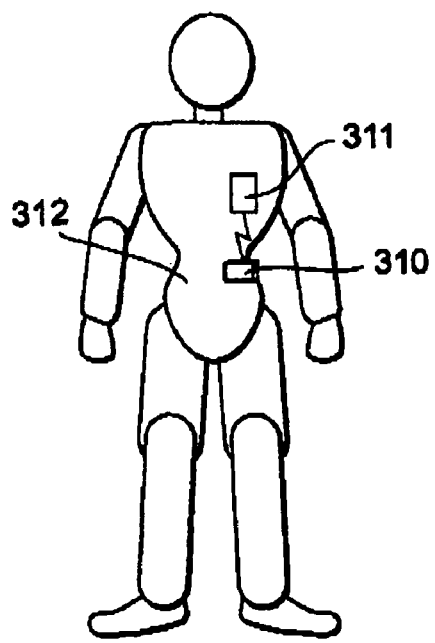

FIG. 9C shows an example of a wearable computer application. The wearable computer 310 is constituted to permit favorable attachment to a human body 312. A sensor 311 detects the health state of the human body 312 (blood pressure, pulse, and so forth, for example), and a sensor signal is then transmitted to the wearable computer 310. Health management can thus be performed by the wearable computer 310.

Figure 9D:
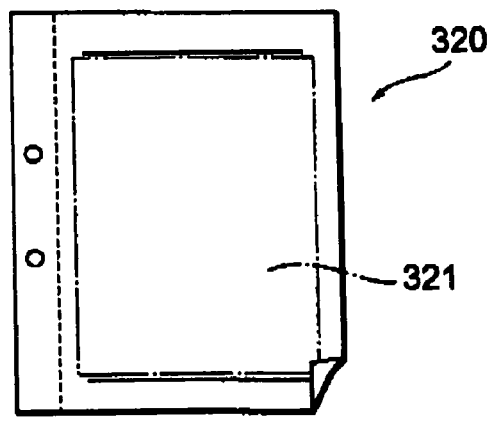

FIG. 9D shows an example of an electronic paper application. The electronic paper 320 comprises a display section 321 that displays an image or similar electronically.

Figure 9E:
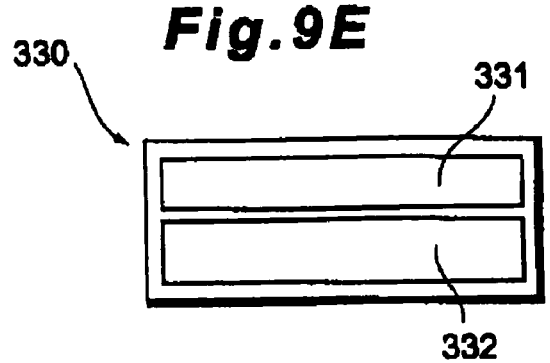

FIG. 9E shows an example of a wireless tag with display function application. The wireless tag with display function 330 comprises a product name display section 331 and a price/sales unit display section 332.

What is claimed is:

1. A panel comprising:
   a substratum;
   a plurality of scan lines formed on the substratum;
   a plurality of data lines intersecting with the plurality of scan lines wherein the plurality of data lines are formed on the substratum;
   a plurality of pixels disposed at locations where the plurality of scan lines intersect with the plurality of data lines; and
   a peripheral circuit formed on the substratum;
   wherein the peripheral circuit includes first and second processes, and the first and second processes are controlled by means of event driving, and the first process requires the second process to forward data, and the second process forwards the data to the first process,
   wherein the first process includes a first port, and the second process includes a second port, and the first and second ports are connected via a channel, and a req signal and an ack signal are sent or received between the first and second ports,
   wherein the second port senses the req signal when the first port raises a level of the req signal from an L level to an H level, and the second port raises a level of the ack signal from the L level to the H level when sensing the req signal, and the first port senses a transition of the ack signal when the level of the ack signal is raised from the L level to the H level, and the first port lowers the level of the req signal from the H level to the L level,
   wherein the peripheral circuit further includes a rendezvous circuit, the first port includes an encoder, and the second port includes a decoder, and data is sent from the first port to the second port, and the data received by the second port is input to the rendezvous circuit,
   wherein the rendezvous circuit performs a function so that a next transaction of sending and receiving request and acknowledge signals is not started until all the transactions that are in progress have ended.

2. The panel according to claim 1, wherein the peripheral circuit includes thin film transistors.

3. The panel according to claim 1, further comprising:
   a scan line driver for outputting scanning signals on the plurality of scan lines wherein the scan line driver is formed on the substratum; and
   a data line driver for outputting data signals on the plurality of data lines wherein the data line driver is formed on the substratum.

4. The panel according to claim 1, wherein the substratum is a glass substratum.

5. The panel according to claim 1, wherein the peripheral circuit renders an image displayed by the plurality of pixels.

6. The panel according to claim 1, wherein each of the plurality of pixels includes a switching element.

7. The panel according to claim 1, wherein the peripheral circuit includes a CPU.

8. The panel according to claim 1, wherein the peripheral circuit includes a memory.

9. A display device comprising the panel according to claim 1, wherein the panel is an organic EL panel.

10. A display device comprising the panel according to claim 1, wherein the panel is a liquid crystal display panel.

11. A display device comprising the panel according to claim 1, wherein the panel is an electrophoretic panel.

12. An electronic device comprising the panel according to claim 1.

13. An electronic device comprising the display device according to claim 9.

* * * * *